(12) United States Patent
Dewey, III et al.

(10) Patent No.: US 6,473,887 B1
(45) Date of Patent: Oct. 29, 2002

(54) INCLUSION OF GLOBAL WIRES IN CAPACITANCE EXTRACTION

(75) Inventors: L. William Dewey, III, Wappingers Falls, NY (US); Peter A. Habitz, Hinesburg, VT (US); Edward W. Seibert, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/560,065

(22) Filed: Apr. 27, 2000

(51) Int. Cl.[7] .............................. G06F 9/45; G06F 17/50
(52) U.S. Cl. ............................................. 716/5
(58) Field of Search ...................... 716/1–21; 438/15

(56) References Cited

U.S. PATENT DOCUMENTS

| | | | |
|---|---|---|---|
| 5,477,460 A | 12/1995 | Vakirtzis et al. | 716/5 |
| 5,596,506 A | 1/1997 | Petschauer et al. | 716/5 |
| 5,657,242 A * | 8/1997 | Sekiyama et al. | 716/15 |
| 5,901,063 A | 5/1999 | Chang et al. | 716/4 |
| 5,923,565 A | 7/1999 | Smith et al. | 703/4 |
| 5,926,397 A | 7/1999 | Yamanouchi | 716/14 |
| 5,943,486 A * | 8/1999 | Fukui et al. | 716/9 |
| 6,057,171 A * | 5/2000 | Chou et al. | 716/4 |
| 6,061,508 A * | 5/2000 | Mehrotra et al. | 716/6 |
| 6,077,308 A * | 6/2000 | Carter et al. | 716/8 |
| 6,185,722 B1 * | 2/2001 | Darden et al. | 716/5 |
| 6,230,304 B1 * | 5/2001 | Groeneveld et al. | 716/7 |
| 6,286,128 B1 * | 9/2001 | Pileggi et al. | 716/18 |

* cited by examiner

Primary Examiner—Vuthe Siek
Assistant Examiner—Helen Rossoshek
(74) Attorney, Agent, or Firm—McGinn & Gibb, PLLC; Richard A. Henkler, Esq.

(57) ABSTRACT

A method and structure for performing capacitance extraction during the design of an integrated circuit includes inputting a specified wiring density and design requirements, determining a minimum spacing for wire segments based on the design requirements, calculating a transparency factor based on the wiring density, calculating a lateral capacitance assuming virtual wires are present in the integrated circuit, and calculating a vertical capacitance based on the transparency factor.

21 Claims, 2 Drawing Sheets

INCLUSION OF GLOBAL WIRES IN CAPACITANCE EXTRACTION

BACKGROUND OF THE INVENTION

1. Field of the Invention

The present invention generally relates to the design process of integrated circuits and more particularly to a method and system for performing capacitance extraction that includes the effects of wiring not included in the data being extracted. This invention includes the effect of possible additional wiring during the calculation of capacitance using virtual wires and virtual fillshapes to increase efficiency.

2. Description of the Related Art

Conventional systems perform an "extraction" process which calculates the parasitic capacitance between the devices and wiring formed within an integrated circuit. Extraction processes that are performed on large, multi-level integrated circuit structures require large amounts of computing power. Therefore, many conventional methods are utilized to simplify the extraction process.

For example, some conventional systems divide the integrated circuit structure into different sections and/or levels of hierarchy. Each of the different sections and/or levels is extracted individually. The individual capacitances are then combined to find the overall parasitic capacitance of the circuit as a whole.

However, when performing a capacitance extraction upon a small portion of the overall integrated circuit design, many of the final wiring patterns (e.g. wiring which will eventually connect the different portions of the circuit) are not known because the remainder of the circuit has not yet been designed or is removed from the extraction data for efficiency. In order to make the capacitance calculation more accurate, the conventional systems must design and estimate the precise location and size of the wiring patterns that will be present after final assembly of the design and will impact each section of the circuit.

Often, the estimated wiring pattern cannot be known with certainty, which makes the parasitic capacitance calculation inaccurate. Further, the calculation and estimation of where the wiring patterns and fillshapes will be located is a cumbersome and time consuming process. These factors increase the cost and design time of conventional integrated circuits. Also the recognition of each edge of the environment increases the extraction effort significantly. Therefore, there is a need for a method and system which eliminates the requirement of adding wiring patterns to portions of an integrated circuit design when performing parasitic capacitance extraction procedures.

SUMMARY OF THE INVENTION

It is, therefore, an object of the present invention to provide a structure and method for performing capacitance extraction during the design of an integrated circuit, that includes inputting a specified wiring density and design requirements, determining a minimum spacing for wire segments based on the design requirements, calculating a transparency factor based on the wiring density, calculating a lateral capacitance assuming virtual wires are present in the integrated circuit, and calculating a vertical capacitance based on the transparency factor. The invention adds virtual wires to the integrated circuit where allowed by the minimum spacing. The virtual wires comply with the wiring density. The virtual wires are imaginary and are not included in a final design of the integrated circuit. The virtual wires only explain and motivate the change in the calculation of capacitance during extraction.

The invention also divides the integrated circuit into sections and performs the capacitance extraction on each of the sections independently. The virtual wires are theoretically added to each of the sections in order to include the capacitance effect of the other section onto the extracted circuit. As actual shapes are never created and extracted, the invention is much more efficient than conventional methods which have to resolve the actual edges of the environment conductors. The effect of the virtual shapes is evident during the calculation. Vertical fill shapes can be added and tied to the virtual shape node. Fill shapes also partially or completely screen vertical capacitance. Then the capacitance to the real shape is reduced with a transparency factor, which comprises a measure of capacitance screening of a layer within the integrated circuit. The part screened off is connected to virtual shapes node. The virtual shapes node is also used to add lateral capacitance to a circuit net.

DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As discussed above, the complete wiring pattern within a portion of an integrated circuit that is being designed cannot be known with certainty. Further, estimating the location of wiring within small portions of the integrated circuit is a time-consuming and expensive process.

The invention overcomes these problems and performs an extraction of parasitic capacitance within each portion of an integrated circuit by considering "virtual" or "imaginary" global wiring patterns. The invention's global wiring patterns are estimations of what the final wiring pattern might contain. The invention offers the customer input to shape the environment assumptions with his knowledge and expectation of the final circuits. The user alters the virtual global wiring pattern depending upon the expected density, process corner, size, etc. of the global wires.

Figure 1:
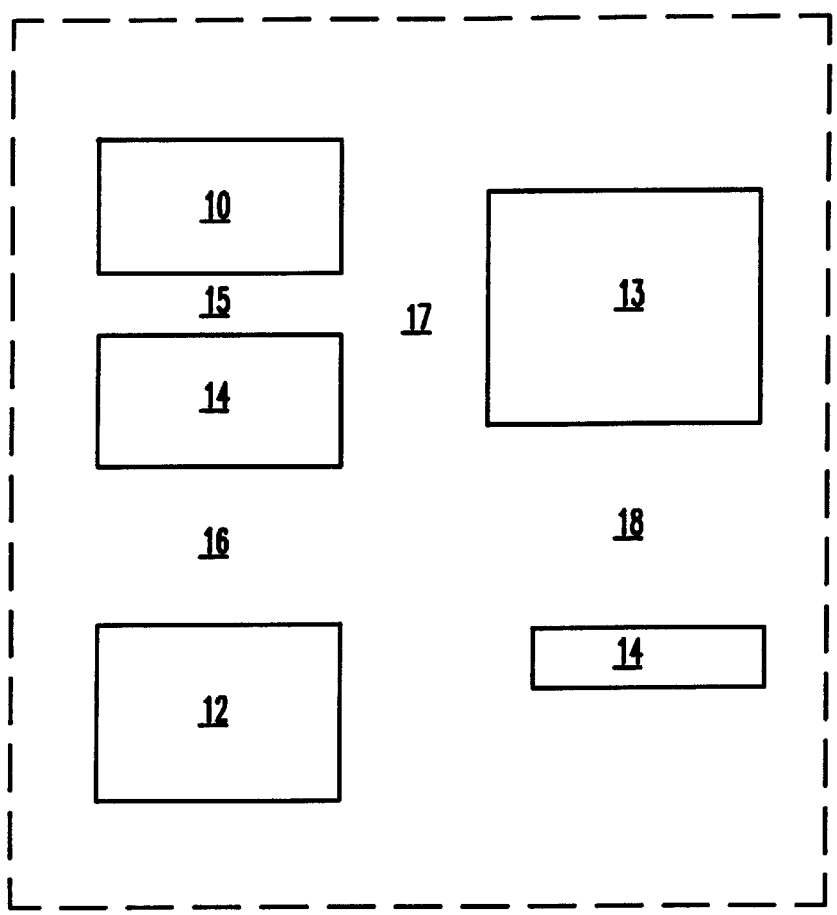
FIG. 1 is a schematic diagram of a portion of an integrated circuit.
Figure 2A:
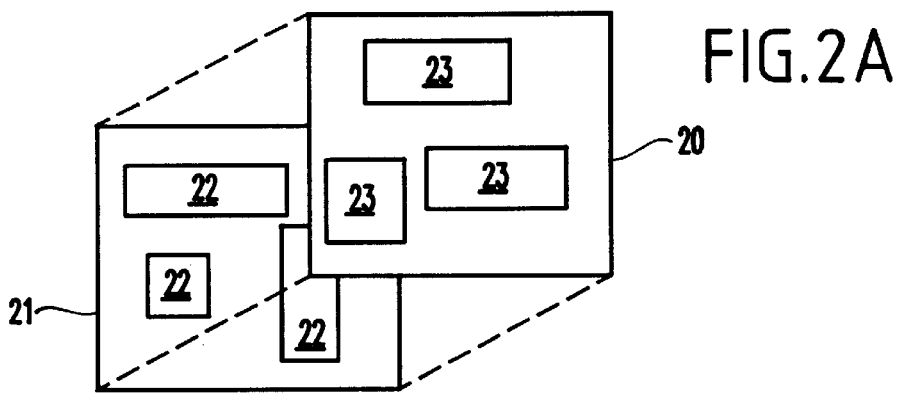
FIG. 2A is a perspective diagram of a portion of an integrated circuit.
Figure 2B:
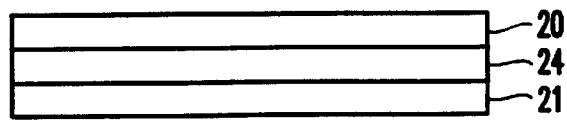
FIG. 2B is a schematic diagram of a cross-sectional view of the structure shown in FIG. 2A.

Referring now to FIG. 1, a schematic diagram of a portion of an integrated circuit (e.g. a "leaf cell" or "book") is illustrated. This portion of the integrated circuit includes various devices 10–14 which have different spacing 15–18 between them.

The invention first performs a process of adding virtual wires wherever it can within the small portion of the integrated circuit. Therefore, if the minimum wire size was above the spacing 15 but less than the spacings 16–18, the invention would add virtual wires to areas 16–18. This is tempered with the expected density of the global wiring.

More specifically, for a low expected global wiring density, a virtual wire may be added only in area 18. For a medium expected global wiring density virtual wires may be added in regions 17 and 18. For a high expected global wiring density, virtual wires may be added to areas 16–18.

The expected virtual wiring density can be altered to calculate different parasitic capacitance scenarios, such as best case (low density), median case (medium density), or worst case (high density). The invention also requires that the process design requirements of the circuit be input. Therefore, items such as the minimum spacing between devices and wiring, the minimum wiring size, etc. are input to allow the invention to generate the imaginary global wiring.

The invention also refers to a library of information regarding the various devices 10–14 utilized to form the integrated circuits. Such a library is often called a technology file. The technology file will contain information regarding the size of the wiring that will be placed between the various device elements 10–14 within the small portion of the integrated circuit being designed.

The invention calculates capacitance laterally between the devices and vertically between different layers of the integrated circuit device. These calculations are performed using conventional methods well known to those ordinarily skilled in the art. However, the invention is different than conventional methods in that, for example, the invention supplies the generic global wiring pattern and does not require that actual global wiring patterns be designed or estimated. Therefore, the invention is more automated than conventional systems, and requires less design resources.

Further, the invention allows impact studies to be performed with the global wiring. More specifically, the invention can extract the capacitance from a given portion of an integrated circuit design under different theoretical operating conditions. Thus, in one extraction process, the virtual global wiring can be connected to ground. In a different extraction process, the virtual global wiring can be connected to a noise signal. In this manner, the integrated circuit can be tested to determine its ability to withstand undesirable noise. As would be known by one ordinarily skilled in the art given this disclosure, the circuit can be similarly tested under other commonly encountered conditions.

The invention will add virtual global wires to both layers 21, 20 depending upon the various factors such as wiring density, as discussed above. In addition, the invention calculates the screening effect of the fillshape layer 24 between the layers 20, 21. If layer 24 is a pure insulator layer, the capacitance between the devices and wiring in layers 20 and 21 can be calculated in a straightforward manner. However, as mentioned above, layer 24 often includes many devices (e.g., global wiring and non-functioning balancing devices). These devices interrupt the pure insulation effect of layer 24 and reduce (or screen) the capacitance between the layers 20, 21.

Conventional extraction programs required that the designer provide or estimate of the makeup of the layer 24. Again, as discussed above, the additional designer time required in such a process dramatically increases the cost of the integrated circuit being developed. The invention overcomes this problem by substituting a transparency factor to determine the screening effect between the layers 20, 21. More specifically, the user inputs the estimated percentage of transparency that the shape fill layer 24 will provide. Alternatively, the invention can directly calculate the transparency factor based upon the specified density for global wires. For example, if all spaces within a fillshape layer 24 are utilized, the fillshape layer 24 will have a transparency of 0%. If half the shape fill layer 24 is consumed by devices/wiring, the transparency is calculated by field calculations to include the effect of fringing to the intermediate layers. These calculations are done once per technology in advance and the results are stored in the technology file. For each typical pattern density these calculations are done and the resulting transparency factors are provided to the extraction program via the technology file.

Thus, the invention avoids having to estimate or prepare the shape fill layer 24 by utilizing a transparency factor to adjust to the vertical capacitance extraction between layers 20, 21. This feature of the invention increases the efficiency and accuracy of the extraction process when compared to conventional extraction systems.

Therefore, the invention calculates the lateral capacitance of adjacent devices within a single layer of an integrated circuit accurately by adding the capacitance for generic or imaginary global wiring where appropriate, as discussed above. In addition, the invention calculates the vertical capacitance depending upon the transparency between two layers.

Figure 3:
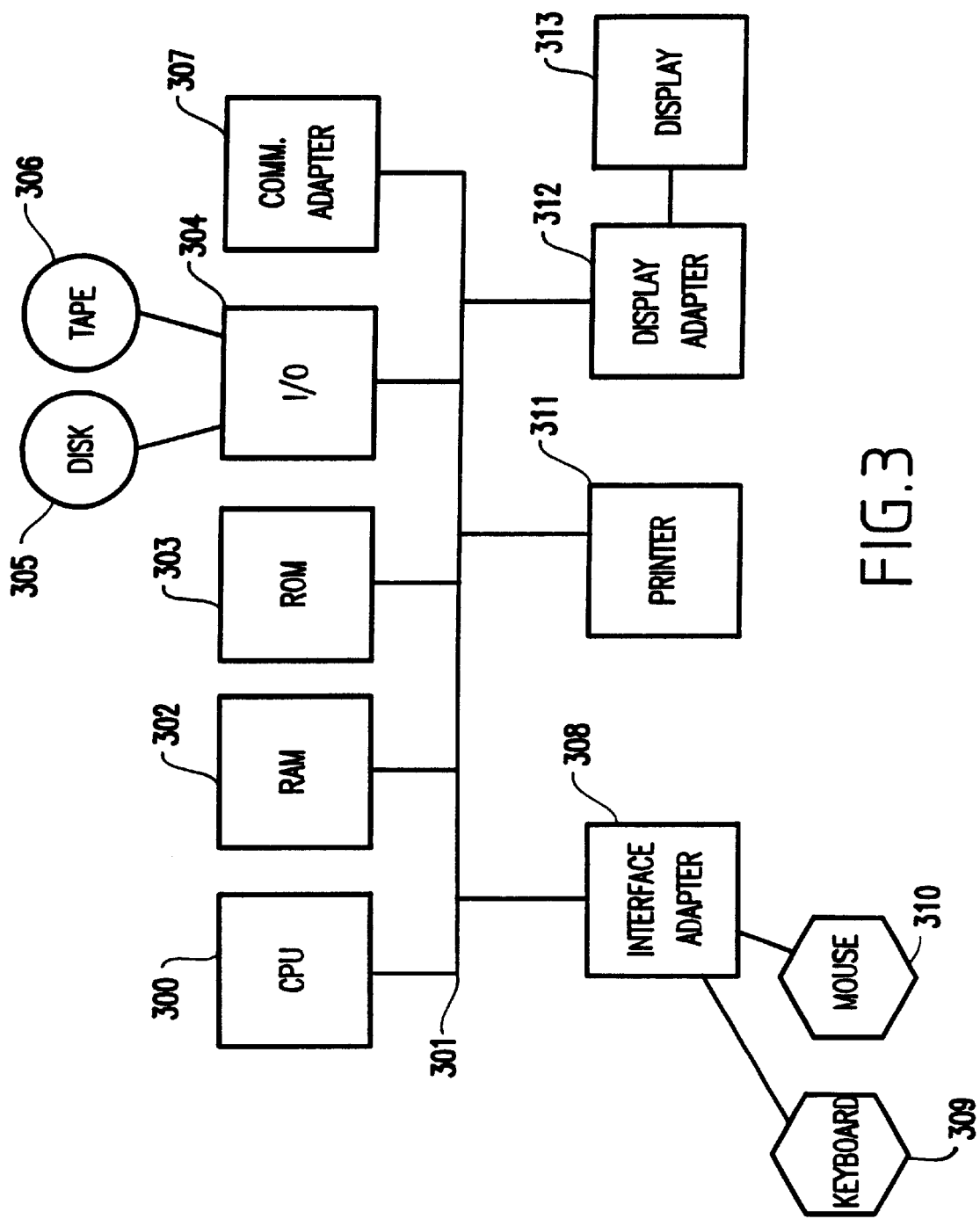
FIG. 3 is a hardware embodiment of the invention.

While the overall methodology of the invention is described above, the invention can be embodied in any number of different types of systems and executed in any number of different ways, as would be known by one ordinarily skilled in the art. For example, as illustrated in FIG. 3, a typical hardware configuraton of an information handlin/computer system in accordance with the invention preferably has at least one processor or central processing unit (CPU) 300. For example, the central processing unit 300 could include various image/texture processing units, mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc.

The CPU 300 is interconnected via a system bus 301 to a random access memory (RAM) 302, read-only memory (ROM) 303, input/output (I/O) adapter 304 (for connecting peripheral devices such as disk units 305 and tape drives 306 to the bus 301), communication adapter 307 (for connecting an information handling system to a data processing network) user interface adapter 308 (for connecting a peripherals 309–310 such as a keyboard, mouse, imager, microphone, speaker and/or other interface device to the bus 301), a printer 311, and display adapter 312 (for connecting the bus 301 to a display device 313). The invention could be implemented using the structure shown in FIG. 3 by including the inventive method, described above, within a computer program stored on the storage device 305. Such a computer program would act on a circuit design supplied through the interface units 309–310 or through the network connection 307 or storage device 305–306. The system would then automatically perform the extraction and output the same on the display 313 on the storage device 306, through the printer 311 or back to the network 307.

The invention is superior to conventional extraction programs for a number of reasons. First, since the generic global wiring pattern is generated in an automated fashion using the expected wiring density, expected wire size, and spacing of the devices on the integrated circuit design, the invention does not require additional design time or associated resources. Also, the invention does not require any significant computing overhead and is easily implemented into current extraction programs without significantly increasing processing time. Further, the invention is more accurate than conventional systems because the virtual wiring generated with the invention very closely approximates (on average) the effect that the actual wiring will have upon the extracted parasitic capacitance. To the contrary, systems which require manual "estimation" of the actual global wiring patterns may be very inaccurate if the "estimation") is inconsistent with the actual global wiring pattern which results from future design.

The invention takes the environment of a design into account without having to design the actual shapes, thus saving design time and without having to extract the environment shapes thus saving extraction time. The invention merely changes the capacitance calculation method during extraction and delivers the same or better results as the conventional method with a much simpler approach.

While the invention has been described in terms of preferred embodiments, those skilled in the art will recognize that the invention can be practiced with modification within the spirit and scope of the appended claims.

What is claimed is:

1. A method of performing capacitance extraction during the design of an integrated circuit, said method comprising:
   inputting a specified wiring density and design requirements;
   determining a minimum spacing for wire segments based on said design requirements;
   calculating a transparency factor based on said wiring density;
   calculating a lateral capacitance assuming imaginary virtual wires are present in said integrated circuit; and
   calculating a vertical capacitance based on said transparency factor.

2. The method in claim 1, further comprising adding said virtual wires to said integrated circuit where allowed by said minimum spacing, said virtual wires complying with said wiring density.

3. The method in claim 1, further comprising dividing said integrated circuit into sections and performing said capacitance extraction on each of said sections independently, wherein said virtual wires are theoretically added to each of said sections without regard to an effect said virtual wires have on another section of said integrated circuit.

4. The method in claim 1, wherein said virtual wires are alternatively connected to ground and noise signals to extract capacitance from said circuit under differing conditions.

5. A method of performing capacitance extraction during the design of an integrated circuit, said method comprising:
   inputting a specified wiring density and design requirements;
   determining a minimum spacing for wire segments based on said design requirements;
   calculating a transparency factor based on said wiring density;
   calculating a lateral capacitance assuming virtual wires are present in said integrated circuit; and
   calculating a vertical capacitance based on said transparency factor;
   wherein said virtual wires are imaginary and are not included in a final design of said integrated circuit.

6. A method of performing capacitance extraction during the design of an integrated circuit, said method comprising:
   inputting a specified wiring density and design requirements;
   determining a minimum spacing for wire segments based on said design requirements;
   calculating a transparency factor based on said wiring density;
   calculating a lateral capacitance assuming virtual wires are present in said integrated circuit; and
   calculating a vertical capacitance based on said transparency factor;
   wherein said virtual wires are utilized exclusively for said capacitance extraction.

7. A method of performing capacitance extraction during the design of an integrated circuit, said method comprising:
   inputting a specified wiring density and design requirements;
   determining a minimum spacing for wire segments based on said design requirements;
   calculating a transparency factor based on said wiring density;
   calculating a lateral capacitance assuming virtual wires are present in said integrated circuit; and
   calculating a vertical capacitance based on said transparency factor;
   wherein said transparency factor comprises a measure of capacitance screening of a layer within said integrated circuit.

8. A method of performing capacitance extraction on an integrated circuit, said method comprising:
   inputting a specified wiring density and design requirements;
   determining a minimum spacing for wire segments based on said design requirements;
   adding imaginary virtual wires to said integrated circuit where allowed by said minimum spacing, said virtual wires complying with said wiring density; and
   calculating a lateral capacitance assuming said virtual wires are present in said integrated circuit.

9. The method in claim 8, further comprising dividing said integrated circuit into sections and performing said capacitance extraction on each of said sections independently, wherein said virtual wires are theoretically added to each of said sections without regard to an effect said virtual wires have on another section of said integrated circuit.

10. The method in claim 8, wherein said virtual wires are alternatively connected to ground and noise signals to extract capacitance from said circuit under differing conditions.

11. A method of performing capacitance extraction on an integrated circuit, said method comprising:
    inputting a specified wiring density and design requirements;
    determining a minimum spacing for wire segments based on said design requirements;
    adding virtual wires to said integrated circuit where allowed by said minimum spacing, said virtual wires complying with said wiring density; and
    calculating a lateral capacitance assuming said virtual wires are present in said integrated circuit;
    wherein said virtual wires are imaginary and are not included in a final design of said integrated circuit.

12. A method of performing capacitance extraction on an integrated circuit, said method comprising:
    inputting a specified wiring density and design requirements;

determining a minimum spacing for wire segments based on said design requirements;

adding virtual wires to said integrated circuit where allowed by said minimum spacing, said virtual wires complying with said wiring density; and calculating a lateral capacitance assuming said virtual wires are present in said integrated circuit;

wherein said virtual wires are utilized exclusively for said capacitance extraction.

13. A method of performing capacitance extraction on an integrated circuit, said method comprising:

inputting a specified wiring density and design requirements;

determining a minimum spacing for wire segments based on said design requirements;

adding virtual wires to said integrated circuit where allowed by said minimum spacing, said virtual wires complying with said wiring density;

calculating a lateral capacitance assuming said virtual wires are present in said integrated circuit;

calculating a transparency factor based on said wiring density; and calculating a vertical capacitance based on said transparency factor.

14. The method in claim 13, wherein said transparency factor comprises a measure of capacitance screening of a layer within said integrated circuit.

15. A program storage device readable by machine, tangibly embodying a program of instructions executable by the machine to perform capacitance extraction during the design of an integrated circuit, said method comprising:

inputting a specified wiring density and design requirements;

determining a minimum spacing for wire segments based on said design requirements;

calculating a transparency factor based on said wiring density;

calculating a lateral capacitance assuming imaginary virtual wires are present in said integrated circuit; and calculating a vertical capacitance based on said transparency factor.

16. The program storage device in claim 15, further comprising adding said virtual wires to said integrated circuit where allowed by said minimum spacing, said virtual wires complying with said wiring density.

17. The program storage device in claim 15, further comprising dividing said integrated circuit into sections and performing said capacitance extraction on each of said sections independently, wherein said virtual wires are theoretically added to each of said sections without regard to an effect said virtual wires have on another section of said integrated circuit.

18. The program storage device in claim 15, wherein said virtual wires are alternatively connected to ground and noise signals to extract capacitance from said circuit under differing conditions.

19. A program storage device readable by machine, tangibly embodying a program of instructions executable by the machine to perform capacitance extraction during the design of an integrated circuit, said method comprising:

inputting a specified wiring density and design requirements;

determining a minimum spacing for wire segments based on said design requirements;

calculating a transparency factor based on said wiring density;

calculating a lateral capacitance assuming virtual wires are present in said integrated circuit; and calculating a vertical capacitance based on said transparency factor;

wherein said virtual wires are imaginary and are not included in a final design of said integrated circuit.

20. A program storage device readable by machine, tangibly embodying a program of instructions executable by the machine to perform capacitance extraction during the design of an integrated circuit, said method comprising:

inputting a specified wiring density and design requirements;

determining a minimum spacing for wire segments based on said design requirements;

calculating a transparency factor based on said wiring density;

calculating a lateral capacitance assuming virtual wires are present in said integrated circuit; and calculating a vertical capacitance based on said transparency factor;

wherein said virtual wires are utilized exclusively for said capacitance extraction.

21. A program storage device readable by machine, tangibly embodying a program of instructions executable by the machine to perform capacitance extraction during the design of an integrated circuit, said method comprising:

inputting a specified wiring density and design requirements;

determining a minimum spacing for wire segments based on said design requirements;

calculating a transparency factor based on said wiring density;

calculating a lateral capacitance assuming virtual wires are present in said integrated circuit; and calculating a vertical capacitance based on said transparency factor;

wherein said transparency factor comprises a measure of capacitance screening of a layer within said integrated circuit.

* * * * *